(12) United States Patent
Hong

(10) Patent No.: US 8,981,364 B2
(45) Date of Patent: Mar. 17, 2015

(54) ORGANIC LIGHT EMITTING DIODE DISPLAY

(71) Applicant: Samsung Display Co., Ltd., Yongin (KR)

(72) Inventor: Sang-Min Hong, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/036,683

(22) Filed: Sep. 25, 2013

(65) Prior Publication Data

US 2014/0353600 A1    Dec. 4, 2014

(30) Foreign Application Priority Data

May 30, 2013 (KR) .................. 10-2013-0062049

(51) Int. Cl.
*H01L 29/08* (2006.01)
*H01L 35/24* (2006.01)
*H01L 51/00* (2006.01)
*H01L 27/32* (2006.01)

(52) U.S. Cl.
CPC ................................ *H01L 27/3276* (2013.01)
USPC .......................................................... 257/40

(58) Field of Classification Search
USPC ........ 257/40, 88, 99, 642–643, 759, E33.059, 257/E21.503, E51.001–E51.052, 257/E25.008–E25.009, 98, E39.007, 257/E27.117–E27.119, 66, 72, 223, 227, 257/291, 292, 439, 443, 655, E27.1, 257/E27.125, E27.112, E29.145, E29.147, 257/E29.151, E29.182, E29.202, 257/E29.273–E29.299, E29.314, E29.32, 257/E23.016, E21.7, E29.033, E29; 438/149, 163, 29, 69, 82, 99, 28
See application file for complete search history.

(56) References Cited

U.S. PATENT DOCUMENTS

| 8,866,133 | B2 * | 10/2014 | Sagawa ........................... 257/40 |
| 2004/0017335 | A1 * | 1/2004 | Kobayashi et al. ............ 345/82 |
| 2007/0228367 | A1 * | 10/2007 | Nakamura ....................... 257/40 |
| 2009/0224256 | A1 * | 9/2009 | Shin ................................ 257/72 |
| 2013/0187139 | A1 * | 7/2013 | Sagawa ........................... 257/40 |
| 2013/0303777 | A1 * | 11/2013 | Okamoto et al. ............. 548/103 |

FOREIGN PATENT DOCUMENTS

| KR | 10-2000-0022732 | 4/2000 |
| KR | 10-2011-0042663 | 4/2011 |

\* cited by examiner

*Primary Examiner* — Dao H Nguyen
*Assistant Examiner* — Tram H Nguyen
(74) *Attorney, Agent, or Firm* — H.C. Park & Associates, PLC

(57) ABSTRACT

An organic light emitting diode display including a first electrode disposed in a display area of a display panel, and electrically connected to a transistor connected to a gate wiring and a data wiring; a pixel definition film provided on the display panel, and having an opening through which the first electrode is exposed; organic emission layers disposed on the first electrode; column spacers disposed on non-display areas of the display panel, and disposed on the pixel definition layer; a second electrode disposed on the organic emission layers and the column spacers; and signal blocking metal wirings disposed on both side edges of the organic emission layers, and disposed between the first electrode and the second electrode.

17 Claims, 4 Drawing Sheets

ORGANIC LIGHT EMITTING DIODE DISPLAY

CROSS-REFERENCE TO RELATED APPLICATION

This application claims priority from and the benefit of Korean Patent Application No. 10-2013-0062049, filed on May 30, 2013, which is hereby incorporated by reference for all purposes as if fully set forth herein.

BACKGROUND

1. Field

Exemplary embodiments of the present invention relate to an organic light emitting diode display.

2. Discussion of the Background

An organic light emitting diode display includes two electrodes, and an organic light emitting diode (OLED) interposed therebetween. Electrons injected from a cathode, which is one electrode, and holes injected from an anode, which is the other electrode, are combined in an organic light emitting member to form excitons, and light is emitted while the excitons discharge energy.

The cathode and the anode are generally formed of metal, and a display panel having the organic light emitting diode, a sealing member opposed to the display panel to protect the organic light emitting diode of the display panel, and a sealant bonding and sealing the display panel and the sealing member are provided between the cathode and the anode. The cathode is formed on an entire surface of an emission portion (pixel area) and a non-emission portion (spacer formed area) of the display panel, and the anode is formed to correspond to the emission portion. A spacer forming a gap is disposed between the cathode and the anode.

A short circuit may be generated by contact between the cathode and the anode due to pressing, cracking, and the like by pressure from outside of the display panel. Such a short circuit may induce local burning of the display, thereby causing a defect of the display.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide an organic light emitting diode display which includes a separate wiring inside a panel in order to inhibit local burning when a short circuit is generated between a cathode and an anode caused by pressure due to external pressure of the display panel.

Additional features of the invention will be set forth in the description which follows, and in part will be apparent from the description, or may be learned by practice of the invention.

An exemplary embodiment of the present invention discloses an organic light emitting diode display including: a display panel; a first electrode disposed in a display area of the display panel and electrically connected to a transistor connected to a gate wiring and a data wiring; a pixel definition film disposed on the display panel, and having an opening through which the first electrode is exposed; organic emission layers disposed on the first electrode; column spacers disposed on non-display areas of the display panel and on the pixel definition layer; a second electrode disposed on the organic emission layers and the column spacers; and signal blocking metal wirings disposed on both side edges of the organic emission layers, and disposed between the first electrode and the second electrode.

An exemplary embodiment of the present invention also discloses an organic light emitting diode display, including: a display panel; a first electrode disposed in a display area of the display panel, the first electrode being electrically connected to a transistor, which is connected to a gate wiring and a data wiring; a pixel definition film disposed on the display panel, and including an opening through which the first electrode is exposed; organic emission layers disposed on the first electrode; spacers disposed on non-display areas of the display panel and on the pixel definition layer; a second electrode disposed on the organic emission layers and the spacers; metal wirings disposed on both side edges of the organic emission layers and between the first electrode and the second electrode; and an insulation layer disposed on the metal wirings and configured to prevent an electrical connection between the second electrode and the metal wirings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
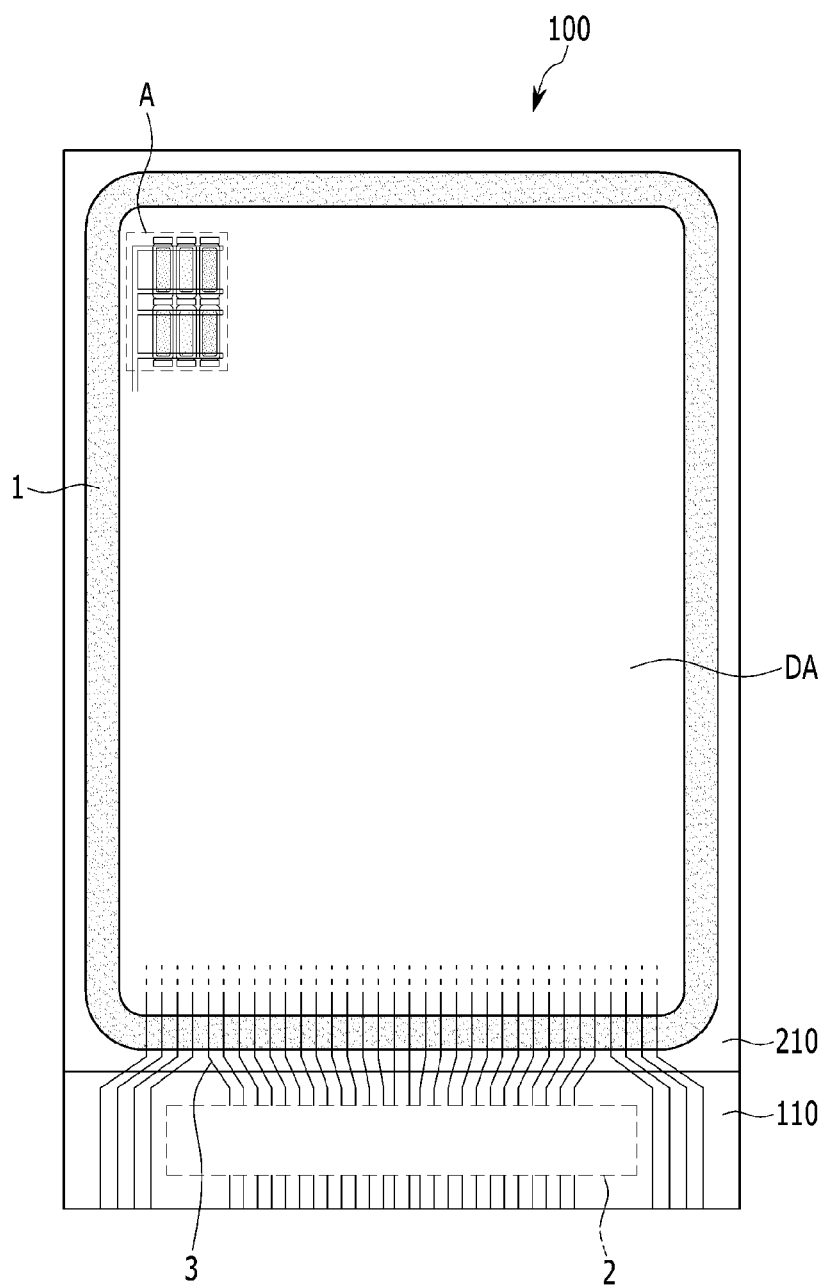
FIG. 1 is a top plan view schematically illustrating an organic light emitting diode display according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

Further, in the exemplary embodiments, since like reference numerals designate like elements having the same configuration, a first exemplary embodiment is representatively described, and in other exemplary embodiments, only a configuration different from the first exemplary embodiment will be described.

It is noted that the drawings are schematically drawn and are not drawn in accordance with a scale. Relative sizes and ratios of parts in the drawings are exaggerated or reduced in their sizes for accuracy and convenience, and a predetermined size is illustrative only, and is not limitative. Further, the same structure, element, or component represented in two or more drawings will be designated by the same reference numerals in order to represent the similar characteristic. It will be understood that when an element is referred to as being "on" or "connected to" another element, it can be directly on or directly connected to the other element, or intervening elements may be present. In contrast, when an element is referred to as being "directly on" or "directly connected to" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ)

An exemplary embodiment specifically illustrates an exemplary embodiment of the present invention. As a result, various modifications of diagrams are expected. Accordingly, exemplary embodiments are not limited to specific shapes of shown regions, and also include, for example, modifications of the shape by manufacturing Hereinafter, an organic light emitting diode display according to an exemplary embodiment will be described with reference to FIGS. 1 to 4.

Figure 2:
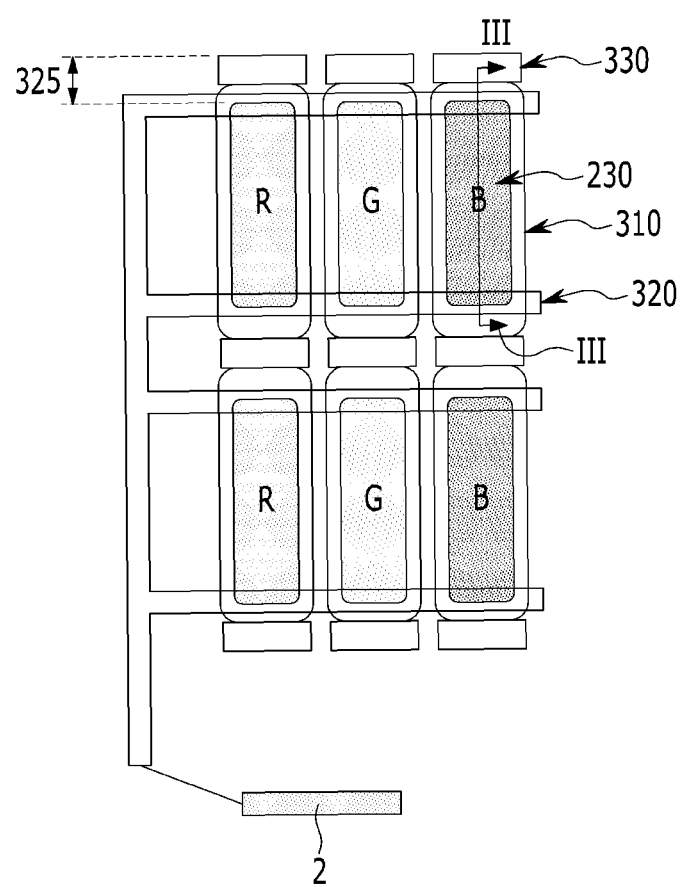
FIG. 2 is an enlarged layout view of part "A" illustrated in FIG. 1.
Figure 3:
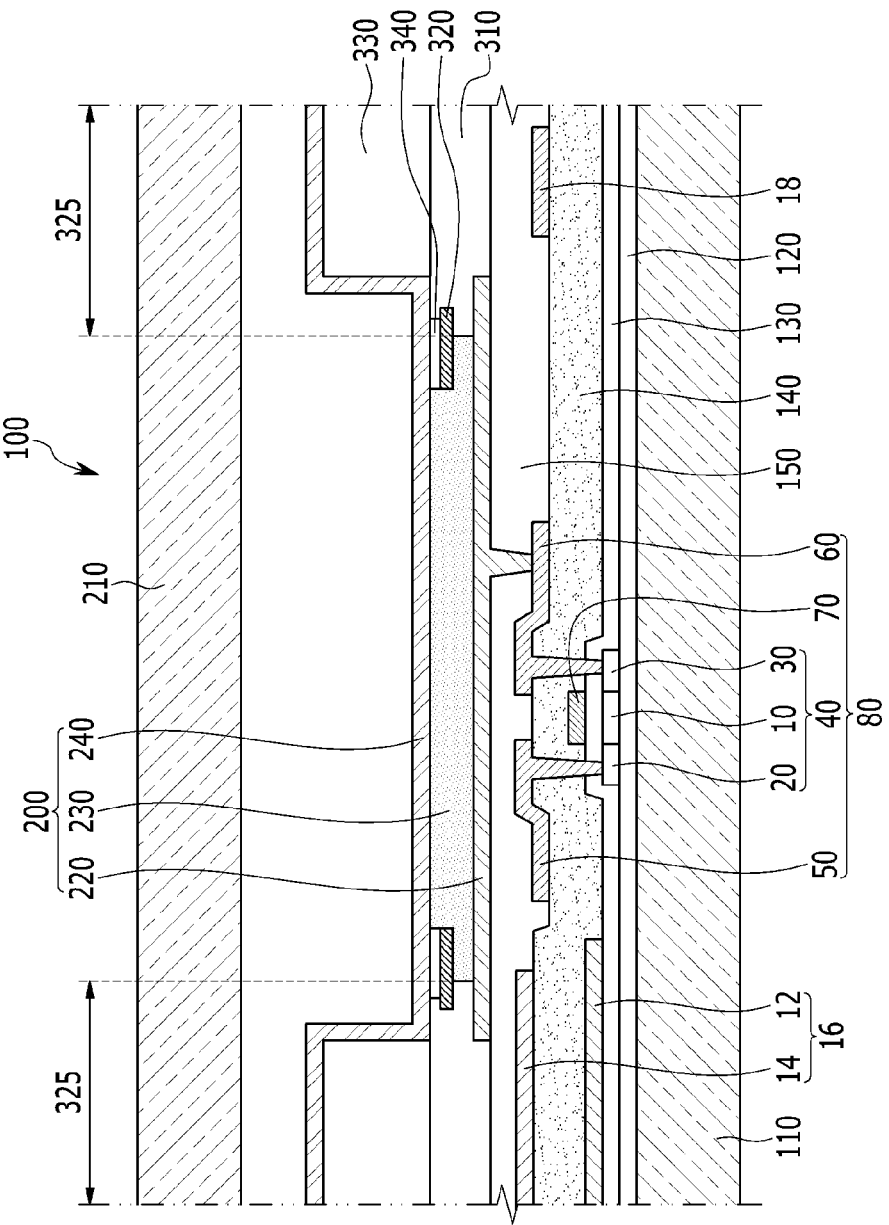
FIG. 3 is a cross-sectional view taken along line III-III of FIG. 2.
Figure 4:
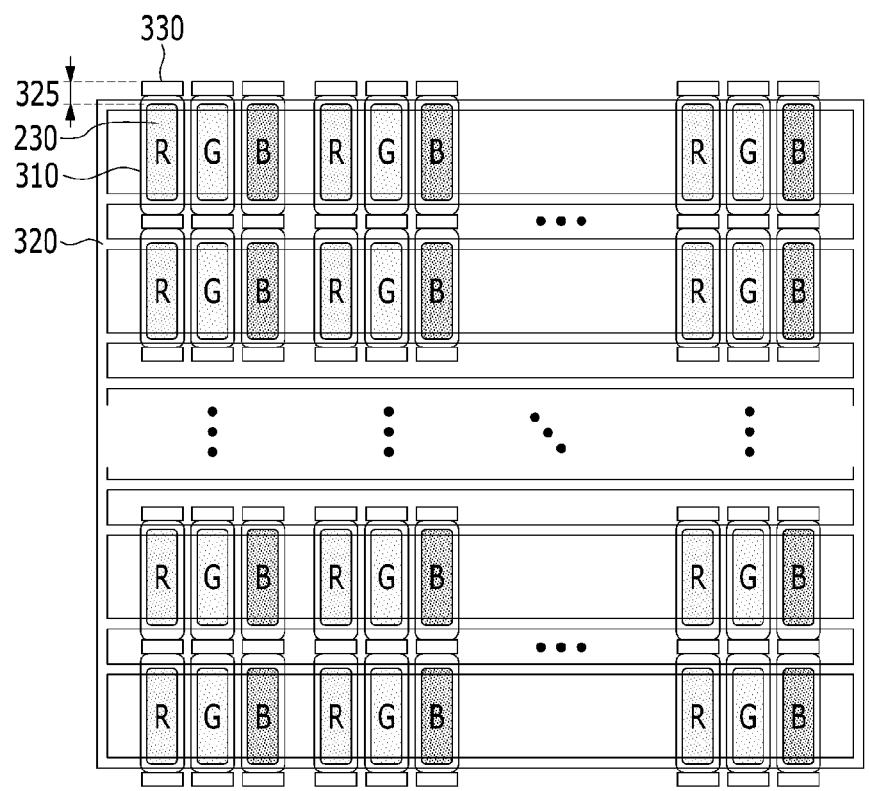
FIG. 4 is a top plan view schematically illustrating a structure of a signal blocking metal wiring of the organic light emitting diode display according to an exemplary embodiment of the present invention.

FIG. 1 is a top plan view schematically illustrating the organic light emitting diode display according to an exemplary embodiment, FIG. 2 is an enlarged layout view of part "A" illustrated in FIG. 1, and FIG. 3 is a cross-sectional view taken along line III-III of FIG. 2. FIG. 4 is a top plan view schematically illustrating a structure of a signal blocking metal wiring of the organic light emitting diode display according to an exemplary embodiment.

As illustrated in FIG. 1, an organic light emitting diode display 100 according to an exemplary embodiment includes a display panel 110, a sealing member 210 for covering the display panel 110, and a sealant 1 disposed between the display panel and the sealing member 210.

The sealant 1 is disposed along an edge of the sealing member 210, and the sealant 1 bonds and seals the display panel 110 and the sealing member 210. Hereinafter, an internal area between the display panel 110 and the sealing member 210 surrounded by the sealant 1 is referred to as a display area DA. Further, pixels are formed in the display area DA to display an image.

The sealing member 210 is a smaller size than the display panel 110. Further, a driver 2 may be mounted in an edge of one side of the display panel 110 which is not covered by the sealing member 210.

Conductive wirings 3 electrically connecting the driver 2 and elements formed inside a space sealed by the sealant 1 are formed at the edge of the display panel 110. Accordingly, the conductive wirings 3 may be formed to partially overlap the sealant 1.

As illustrated in FIG. 2, one pixel may include a red R, green G, and blue B organic emission layer 230, and column spacers 330 are formed on a pixel definition layer 310 in a non-display area 325 along opposing sides of each organic emission layer 230 area. Further, signal blocking metal wirings 320 are commonly formed to overlap opposing sides of the organic emission layer 230.

As illustrated in FIG. 3, an insulation layer 340 for preventing an electrical connection between a second electrode 240 and the signal blocking metal wiring 320 may be further included on the signal blocking metal wiring 320. The signal blocking metal wirings 320 commonly formed on the organic emission layers 230 are connected to each other at one side of the non-display areas 325 to be connected to the driver 2. By this method, the signal blocking metal wirings 320 form a mesh. Further, the signal blocking metal wirings 320 may be formed in a rectangular planar shape.

Referring to FIG. 3, the display panel 110 includes a switching thin film transistor (not illustrated), a driving thin film transistor 80, a capacitor element 16, and an organic light emitting diode 200, which are formed for each pixel. The display panel 110 further includes gate lines disposed in one direction, data lines insulated from and crossing the gate lines, and a common power line. Here, one pixel may be defined based on a boundary of the gate line, the data line, and the common power line, but is not limited thereto.

The organic light emitting diode 200 includes a first electrode 220, the organic emission layer 230 formed on the first electrode 220, and the second electrode 240 formed on the organic emission layer 230. Here, the first electrode 220 is an anode (positive (+) electrode), which is a hole-injection electrode, and the second electrode 240 is a cathode (negative (−) electrode), which is an electron-injection electrode. Holes and electrons are injected into the organic emission layer 230 from the first electrode 220 and the second electrode 240, respectively, to form excitons. When an exciton transitions from an excited state to a ground state, light emission occurs.

The pixel definition layer 310, having an opening through which the first electrode 220 is exposed, is provided on the display panel 110. The column spacers 330 may be provided on the pixel definition layer 310 of the non-display areas 325 of the display panel 110. The second electrode 240 may be disposed while being extended on the organic emission layer 230 and the column spacer 330.

The capacitor element 16 includes a first capacitor plate 12 and a second capacitor plate 14 with an interlayer insulation layer 140 interposed therebetween. Here, the interlayer insulation layer 140 may be a dielectric body. Capacitance is determined by the charge stored by the capacitor element 16 and a voltage between both the capacitor plates 12 and 14.

The driving thin film transistor 80 applies driving power, which makes the organic emission layer 230 of a selected pixel emit light toward the first electrode 220. A driving gate electrode 70 is connected with the first capacitor plate 12. Each of a driving source electrode 50 and the second capacitor plate 14 is connected to the common power line 18. A driving drain electrode 60 is connected to the first electrode 220 of the organic light emitting diode 200 through an electrode contact hole.

The display panel 110 may be formed as an insulation panel formed of glass, quartz, ceramic, plastic, or the like. However, the present invention is not limited thereto. Accordingly, the display panel 10 may also be formed as a metallic panel formed of stainless steel, or the like.

A buffer layer 120 is formed on the display panel 110. The buffer layer 120 prevents impurity elements from permeating a surface of the display panel 110, and also planarizes a surface thereof. The buffer layer 120 may be formed of various materials capable of performing the aforementioned functions. For example, any one of a silicon nitride ($SiN_x$) film, a silicon oxide ($SiO_2$) film, and a silicon oxynitride ($SiO_xN_y$) film may be used as the buffer layer 120. However, the buffer layer 120 is not essential, and may be omitted according to the type and a process condition of the display panel 110.

A driving semiconductor layer 40 is formed on the buffer layer 120. The driving semiconductor layer 40 is formed of a polycrystalline silicon film. Further, the driving semiconductor layer 40 includes a channel area 10, in which an impurity is not doped, and a source area 20 and a drain area 30 formed by p+ doping both sides of the channel area 10. In this case, the doped ion material is a P-type impurity, such as boron (B), and $B_2H_6$ may be used as the doped ion material. Here, the impurity depends on the type of thin film transistor.

In an exemplary embodiment, the thin film transistor having a PMOS structure using the P-type impurity is used as the driving thin film transistor 80, but the present invention is not limited thereto. Accordingly, a thin film transistor having an NMOS structure or a CMOS structure may be used as the driving thin film transistor 80. Further, the driving thin film transistor 80 may be a polycrystalline thin film transistor including a polycrystalline silicon film.

A gate insulation layer 130 formed of silicon nitride ($SiN_x$), silicon oxide ($SiO_2$), or the like is formed on the driving semiconductor layer 40. A gate wiring including the driving gate electrode 70 is formed on the gate insulating layer 130. Further, the gate wiring further includes the gate lines, the first capacitor plate 12, and other wirings. Further, the driving gate electrode 70 is formed so as to overlap at least part of the driving semiconductor layer 40, which may include the channel area 10.

The interlayer insulating film 140 covering the driving gate electrode 70 is formed on the gate insulation layer 130. The gate insulation layer 130 and the interlayer insulation layer 140 commonly have through-holes through which the source area 20 and the drain area 30 of the driving semiconductor layer 40 are exposed. The interlayer insulation layer 140 is formed by using a ceramic based material, such as silicon nitride ($SiN_x$) or silicon oxide ($SiO_2$), similar to the gate insulation layer 130.

A data wiring, including the driving source electrode 50 and the driving drain electrode 60, is formed on the interlayer insulation layer 140. Further, the data wiring further includes the data lines, the common power line 18, the second capacitor plate 14, and other wirings. Further, the driving source electrode 50 and the driving drain electrode 60 are connected to the source area 20 and the drain area 30 of the driving semiconductor layer 40 through the through-holes formed on the interlayer insulation layer 140 and the gate insulation layer 130, respectively.

As described above, the driving thin film transistor 80, including the driving semiconductor layer 40, the driving gate electrode 70, the driving source electrode 50, and the driving drain electrode 60, is formed. The configuration of the driving thin film transistor 80 is not limited to the aforementioned example, and may be variously modified to well-known configurations easily implementable by those skilled in the art.

A planarization film 150 covering the data wiring is formed on the interlayer insulation layer 140. The planarization film 150 serves to remove a step and planarize the interlayer insulation layer 140 in order to improve efficiency of light emission of the organic light emitting diode 200 to be formed on the planarization film 150. Further, planarization film 150 has an electrode contact hole through which a part of the driving drain electrode 60 is exposed.

The planarization film 150 may be formed of any one of an acrylates resin, an epoxy resin, a phenolic resin, a polyamide resin, a polyimides resin, an unsaturated polyester resin, a poly phenylene resin, a poly phenylenesulfide resin, and a benzocyclobutene (BCB) resin.

Further, exemplary embodiments are not limited to the aforementioned structure, and any one of the planarization film 150 and the interlayer insulation layer 140 may also be omitted.

The first electrode 220 of the organic light emitting diode 200 is formed on the planarization film 150. That is, the organic light emitting diode display 100 includes each of the first electrodes 220 disposed at each of the pixels, respectively. In this case, the first electrodes 220 are spaced apart from each other. The first electrode 220 is connected to the driving drain electrode 60 through the electrode contact hole in the planarization film 150.

The pixel definition layer 310 having the opening through which the first electrode 220 is exposed is formed on the planarization film 150. That is, the pixel definition layer 310 has the opening formed at each pixel. Further, the first electrode 220 is disposed to correspond to the opening of the pixel definition layer 310. However, the first electrode 220 need not be disposed only at the opening of the pixel definition layer 310, but may be disposed under the pixel definition layer 310 so that part of the first electrode 220 overlaps the pixel definition film 310. The pixel definition layer 310 may be formed of a resin, such as a polyacrylate resin or a polyimide resin, or a silica-based inorganic material.

The organic emission layer 230 is formed on the first electrode 220, and the second electrode 240 is formed on the organic emission layer 230. As described above, the organic light emitting diode 200, including the first electrode, the organic emission layer 230, and the second electrode 240, is formed.

The organic emission layer 230 is formed of a low molecular organic material or a high molecular organic material. Further, the organic emission layer 230 may be formed of a multiple layers including one or more of the emission layer, the hole-injection layer (HIL), a hole-transporting layer (HTL), an electron-transporting layer (ETL), and the electron-injection layer (EIL). In a case where the organic emission layer 230 includes all of the layers, the hole-injection layer (HIL) is disposed on the first electrode 220, which is the anode, and the hole-transporting layer (HTL), the emission layer, the electron-transporting layer (ETL), and the electron-injection layer (EIL) are sequentially stacked thereon.

In FIG. 3, the organic emission layer 230 is disposed only inside the opening of the pixel definition layer 310, but exemplary embodiments are not limited thereto. Accordingly, the organic emission layer 230 may be formed on the first electrode 220 inside the opening of the pixel definition layer 310, or may be disposed between the pixel definition layer 310 and the second electrode 240. The organic emission layer 230 may further include several layers, such as the hole-injection layer (HIL), the hole-transporting layer (HTL), the electron-transporting layer (ETL), and the electron-injection layer (EIL), together with the emission layer. In this case, the hole-injection layer (HIL), the hole-transporting layer (HTL), the electron-transporting layer (ETL), and the electron-injection layer (EIL), but not the emission layer, may be formed on not only the first electrode 220, but also the pixel definition layer 310, by using an open mask during a manufacturing process, similar to the second electrode 240. That is, one or more layers among the several layers included in the organic emission layer 230 may be disposed between the pixel definition layer 310 and the second electrode 240.

Each of the first electrode 220 and the second electrode 240 may be formed of a transparent conductive material, or a transflective or reflective conductive material. The organic light emitting diode display 100 may be a top-emission type, a bottom-emission type, or a dual emission type according to the type of material forming the first electrode 220 and the second electrode 240.

Indium tin oxide (ITO), indium zinc oxide (IZO), zinc oxide (ZnO), or indium oxide ($In_2O_3$) may be used as the transparent conductive material. Lithium (Li), calcium (Ca), lithium fluoride/calcium (LiF/Ca), lithium fluoride/aluminum (LiF/Al), aluminum (Al), silver (Ag), magnesium (Mg), gold (Au), or the like may be used as the reflective material and the transflective material.

The sealing member 210 is disposed to face the display panel 110 on the second electrode 240. The sealing member 210 may be formed of a transparent material, such as glass or plastic. The sealing member 210 is bonded to the display panel 110 to be sealed through the sealant 1 (illustrated in FIG. 1) formed along the edge thereof.

The signal blocking metal wiring 320 is provided on upper portions of both-side edges of the organic emission layer 230 between the first electrode 220 and the second electrode 240. The signal blocking metal wirings 320 cut the power applied to the display when a short circuit is generated caused by contact between the first electrode 220 and the second electrode 240 as a result of the column spacer 330 being pressed by external force, and the signal blocking metal wirings 320 may be positioned at both edges of the first electrode 220. Further, the signal blocking metal wirings 320 may be provided to be in contact with the second electrode 240 at opposing sides of the first electrode 220. Further, the insulation layer 340 may be further included on the signal blocking metal wiring 320. That is, the signal blocking metal wiring 320 may be provided to be in contact with the insulation layer 340 at opposing sides of the organic emission layers 230.

The signal blocking metal wirings 320 may be extended in one direction at positions corresponding to the non-display areas 325 of the pixels which overlap the pixel definition layer 310. Further, the respective extended signal blocking metal wirings 320 are connected to each other at one side of the non-display areas 325 of the pixels disposed at the outermost non-display area 325 within the sealing member 210 to be connected to the driver 2. When a voltage is applied to the display 100 by a power-on signal of the driver 2 and the first electrode 220 contacts the second electrode 240 because the column spacer 330 is pressed by external pressure or cracks, the power-on signal is blocked through the signal blocking metal wirings 320 to prevent power from being applied to the transistor element 80. Accordingly, it is possible to prevent a generation of local burning in the display 100 when a short circuit is generated between the first electrode 220 and the second electrode 240.

As illustrated in FIG. 4, the signal blocking metal wiring 320 may be formed in a mesh by connecting the portions of wirings extended from the positions corresponding to the non-display areas 325 of the pixels. As illustrated in FIG. 2, the mesh-type signal blocking metal wirings 320 are connected to the driver 2, and may be connected to the driver 2 at both sides of the wirings extended from the positions corresponding to the non-display areas 325 of the pixels of the outermost region. That is, when a short circuit is generated in any one pixel as a result of a collapse of a columnar spacer 330 or the generation of cracks, the power provided by the power-on signal is not directly applied from the driver 2 to the display, and a path of the power-on signal is diverted through a loop, so that the power is cut by a power-off signal, and thus the entire display is not driven.

As described above, in the display according to an exemplary embodiment, it is possible to prevent a defect of the organic light emitting diode display by preventing local burning of the display generated when a short circuit is generated between the cathode and the anode because the columnar spacer collapses as a result of an external force applied to the display panel.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display, comprising:
   a display panel;
   first electrodes disposed in a display area of the display panel, each first electrode being electrically connected to a transistor that is connected to a gate wiring and a data wiring;
   a pixel definition film disposed on the display panel, the pixel definition film comprising openings through which the first electrodes are exposed;
   organic emission layers disposed on the first electrodes;
   column spacers disposed on non-display areas of the display panel and on the pixel definition layer;
   a second electrode disposed on the organic emission layers and the column spacers; and
   signal blocking metal wirings disposed on opposing sides of the organic emission layers and between the first electrodes and the second electrode.

2. The organic light emitting diode display of claim 1, further comprising:
   an insulation layer disposed on the signal blocking metal wirings and configured to prevent an electrical connection between the second electrode and the signal blocking metal wirings.

3. The organic light emitting diode display of claim 1, wherein the signal blocking metal wirings are connected to a driver, and are configured to cut power applied to the display by transferring an off-voltage from the driver to the second electrode when the first electrode and the second electrode are short-circuited.

4. The organic light emitting diode display of claim 1, wherein the signal blocking metal wirings are disposed between opposing sides of the organic emission layers and the column spacers.

5. The organic light emitting diode display of claim 1, wherein the signal blocking metal wirings contact the second electrode.

6. The organic light emitting diode display of claim 2, wherein the signal blocking metal wirings contact the insulation layer.

7. The organic light emitting diode display of claim 1, wherein the signal blocking metal wirings are extended in one direction from positions corresponding to the non-display areas of pixels, respectively.

8. The organic light emitting diode display of claim 7, wherein the ends of the signal blocking metal wirings comprise a mesh formed by connecting the wirings extended in one direction from the positions corresponding to the non-display areas of the pixels, respectively.

9. The organic light emitting diode display of claim 1, wherein the signal blocking metal wirings rectangle rectangular planar shape.

10. An organic light emitting diode display, comprising:
    a display panel;
    first electrodes disposed in a display area of the display panel, the first electrode being electrically connected to a transistor that is connected to a gate wiring and a data wiring;

a pixel definition film disposed on the display panel the pixel definition film comprising openings through which the first electrodes are exposed;

organic emission layers disposed on the first electrodes;

spacers disposed on non-display areas of the display panel and on the pixel definition layer;

a second electrode disposed on the organic emission layers and the spacers;

metal wirings disposed on both opposing sides of the organic emission layers and between the first electrodes and the second electrode; and an insulation layer disposed on the metal wirings and configured to prevent an electrical connection between the second electrode and the metal wirings.

11. The organic light emitting diode display of claim 10, wherein the metal wirings are connected to a driver, and are configured to cut power applied to the display by transferring an off-voltage from the driver to the second electrode when the first electrode and the second electrode are short-circuited.

12. The organic light emitting diode display of claim 11, wherein the metal wirings are disposed between opposing sides of the organic emission layers and the spacers.

13. The organic light emitting diode display of claim 11, wherein the metal wirings contact the second electrode.

14. The organic light emitting diode display of claim 11, wherein the metal wirings contact the insulation layer.

15. The organic light emitting diode display of claim 11, wherein the metal wirings are extended in one direction from positions corresponding to the non-display areas of pixels, respectively.

16. The organic light emitting diode display of claim 15, wherein ends of the metal wirings comprise a mesh formed by connecting the wirings extended in one direction from the positions corresponding to the non-display areas of the pixels, respectively.

17. The organic light emitting diode display of claim 11, wherein the metal wirings form a rectangular planar shape.

* * * * *